(12) United States Patent
Raieszadeh et al.

(10) Patent No.: US 9,419,213 B2
(45) Date of Patent: Aug. 16, 2016

(54) DIRECTLY HEATED RF PHASE CHANGE SWITCH

(71) Applicant: The Regents of The University of Michigan, Ann Arbor, MI (US)

(72) Inventors: Mina Raieszadeh, Ann Arbor, MI (US); Yonghyun Shim, Irvine, CA (US); Muzhi Wang, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 0 days.

(21) Appl. No.: 14/731,726

(22) Filed: Jun. 5, 2015

(65) Prior Publication Data

US 2016/0035973 A1 Feb. 4, 2016

Related U.S. Application Data

(60) Provisional application No. 62/008,884, filed on Jun. 6, 2014.

(51) Int. Cl.
*H01L 45/00* (2006.01)

(52) U.S. Cl.
CPC .............. *H01L 45/06* (2013.01); *H01L 45/126* (2013.01); *H01L 45/144* (2013.01)

(58) Field of Classification Search
CPC .................................................... H01L 45/128
See application file for complete search history.

(56) References Cited

U.S. PATENT DOCUMENTS

| | | | |
|---|---|---|---|
| 8,445,887 B2 | 5/2013 | Yoon et al. | |
| 2006/0102927 A1* | 5/2006 | Fujita | G11C 13/0004 257/130 |
| 2006/0246712 A1* | 11/2006 | Kim | H01L 27/2427 438/622 |
| 2010/0108977 A1 | 5/2010 | Yoon et al. | |
| 2010/0188892 A1* | 7/2010 | Baks | G11C 13/0004 365/163 |
| 2010/0238720 A1 | 9/2010 | Tio Castro et al. | |
| 2010/0309714 A1* | 12/2010 | Meade | G11C 13/0004 365/163 |
| 2011/0127485 A1* | 6/2011 | Cha | H01L 27/2436 257/3 |
| 2012/0025162 A1* | 2/2012 | Shin | H01L 27/2409 257/3 |
| 2012/0051123 A1* | 3/2012 | Liu | H01L 45/06 365/163 |
| 2013/0248805 A1* | 9/2013 | Son | H01L 45/06 257/4 |
| 2014/0264230 A1 | 9/2014 | Borodulin et al. | |

FOREIGN PATENT DOCUMENTS

WO WO-2009128048 A1 10/2009

OTHER PUBLICATIONS

Y. Shim et al "RF Switches Using Phase Change Materials" IEEE (2013).
Muzhi Wang et al., "A Low-Loss Directly Heated Two-Port RF Phase Change Switch", Electron Device Letters, IEEE. Apr. 2014, vol. 35, Issue 4, pp. 491-493 (2014).
Yonghyun Shim et al., "Non-Linearity Analysis of RF Ohmic Switches Based on Phase Change Materials", Electron Device Letters, IEEE Mar. 2014, vol. 35, Issue 3, pp. 405-407 (2014).

* cited by examiner

*Primary Examiner* — Stephen W Smoot
(74) *Attorney, Agent, or Firm* — Harness, Dickey & Pierce, PLC (57) ABSTRACT

An RF switch is provided with a direct heating method. The RF switch is comprised of two RF electrodes disposed on opposing sides of a phase change element. Depending on the state of the phase change material, the RF electrodes form a conductive path through the phase change material for an RF signal. To control the state of the phase change material, the RF switch further includes a heater formed from two heater electrodes. The two heater electrodes are configured to draw a current through the phase change element in a direction transverse to the conductive path.

19 Claims, 7 Drawing Sheets

DIRECTLY HEATED RF PHASE CHANGE SWITCH

CROSS-REFERENCE TO RELATED APPLICATIONS

This application claims the benefit of U.S. Provisional Application No. 62/008,884 filed on Jun. 6, 2014. The entire disclosure of the above application is incorporated herein by reference.

GOVERNMENT CLAUSE

This invention was made with government support under grant number N00014-13-1-0222 awarded by the US Navy/Office of Naval Research. The Government has certain rights in the invention.

FIELD

The present disclosure relates to an RF switch implemented with direct heating of phase change material.

BACKGROUND

Phase change or resistance change materials, such as germanium telluride (GeTe), exhibit two distinct resistivity values, different by several orders of magnitude, when they transition between the crystalline and amorphous states. Advances in micro- and nano-fabrication technology have made it possible to integrate phase change materials into digital non-volatile memory cells and more recently in RF switches. Compared to switches using other solid-state or MEMS technologies, phase change switches (a.k.a vias) offer smaller loss for similar switch sizes with competitive linearity and power handling capability. Recent research also demonstrated phase change switches with incredibly high power handling capability and good linearity, making them a strong candidate for high-power RF applications.

The basic principle of operation for phase change switches is the thermal transition of the phase change layer between crystalline (low-resistance) and amorphous (high-resistance) states. When used as RF switches, the transition between these two states is typically achieved using either of the two Joule heating methods: direct or indirect heating, both with the application of current (or voltage) pulses. In the direct heating approach, the current is drawn through the phase change via itself, whereas in the indirect heating scheme, a heater line is placed adjacent to the switch and is electrically isolated from the RF path but thermally coupled to the via.

The challenge with direct heating structures in the past, specifically for RF applications, is that the DC and RF thermal path are not isolated and therefore, the heater cannot be designed independently. For the heater, high electrical resistance is needed, whereas for the RF path the electrical and contact resistance should be as low as possible. In the indirect heating scheme, a separate conductive path is used for the heater. However, indirect heating schemes have several issues: 1) higher power is required to phase transition the phase change layer; 2) the RF connection to the phase change layer is a local cold spot, resulting in an increased ON resistance. Running higher current through the heater to increase the temperature at the RF/phase change layer contact increases the power consumption and may reduce reliability. The present disclosure addresses these issues using new switch structures.

This section provides background information related to the present disclosure which is not necessarily prior art.

SUMMARY

This section provides a general summary of the disclosure, and is not a comprehensive disclosure of its full scope or all of its features.

In one aspect, an RF switch having two ports is provided. The RF switch includes: a substrate; a bottom heater electrode disposed onto a surface of the substrate; a phase change material disposed onto the bottom heater electrode; an input electrode and an output electrode disposed on opposing sides of the phase change material and operable to form a conductive path for an RF signal through the phase change material; and a top heater electrode disposed onto the phase change material, wherein the top and bottom heater electrodes are configured to draw a current through the phase change material in a direction transverse to the conductive path.

The top heater electrode and the bottom heater electrode can have at least one dimension that narrows from both sides as it approaches a center of the phase change material, thereby concentrating the heat on the phase change material. The bottom heater electrode can also overlap with at least a portion of the input electrode and at least a portion of the output electrode and the bottom heater electrode is electrically separated by the phase change material from the overlapped portions of the input electrode and the output electrode.

In some embodiments, a passivation layer may be disposed between the bottom heater electrode and the substrate. A protection layer may also be disposed on the top heater electrode and/or the phase change material.

In other embodiments, the input electrode and the output electrode abut opposing side surfaces of the phase change material, such that a portion of the input electrode and a portion of the output electrode protrude into side surfaces of the phase change material.

In another aspect of this disclosure, a similar arrangement is provided for an RF switch. In this arrangement, a bottom heater electrode is disposed onto a surface of a substrate and configured to concentrate heat at a center of the bottom heater electrode; a phase change material is disposed onto the bottom heater electrode; an input electrode is disposed on the phase change layer and configured to conduct an RF signal; an output electrode is disposed on the phase change layer and configured to conduct an RF signal, wherein the input electrode and the output electrode abut opposing side surfaces of the phase change material; and a top heater electrode is disposed onto the phase change material and configured to concentrate heat at a center of the top heater electrode, wherein the top and bottom heater are operable to draw a current through the phase change material in a direction transverse to the conductive path.

In yet another aspect of this disclosure, an RF switch is provided with the RF electrodes and the heater electrodes interchanged. The RF switch includes: a substrate; a bottom RF electrode disposed onto a surface of the substrate; a phase change material disposed onto the bottom RF electrode; two heater electrodes disposed on the phase change layer, wherein the two heater electrodes are arranged on opposing sides of the phase change material and form an electrical heating path therethrough; and a top RF electrode disposed onto the phase change material, wherein the top and bottom RF electrodes are configured to form an RF conductive path which is transverse in relation to the electrical heating path.

The two heater electrodes can have at least one dimension that narrows from both sides as it approaches a center of the phase change material, thereby concentrating the heat on the phase change material. The two heater electrodes can also overlap onto a top surface of the bottom RF electrode and electrically separated from it through the phase change material.

In some embodiments, a passivation layer is disposed between the bottom RF electrode and the substrate. A protection layer can also be disposed on the top RF electrode and the phase change material.

In other embodiments, the two heater electrodes abut opposing side surfaces of the phase change material, such that a portion of each heater electrode protrude into side surfaces of the phase change material.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1A:
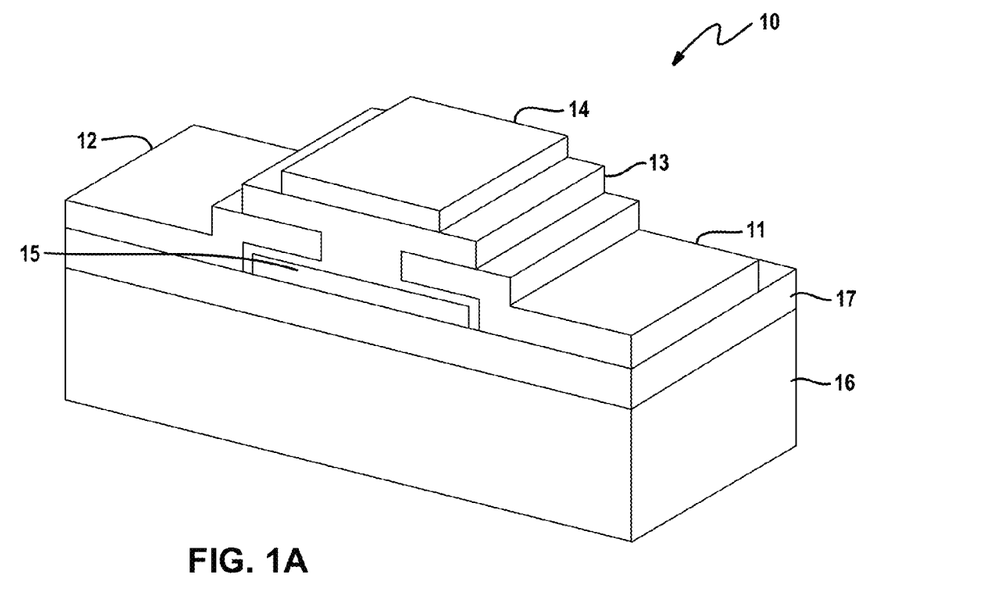
FIG. 1A is a perspective view of an example embodiment of a phase change switch with a direct heating method.
Figure 1B:
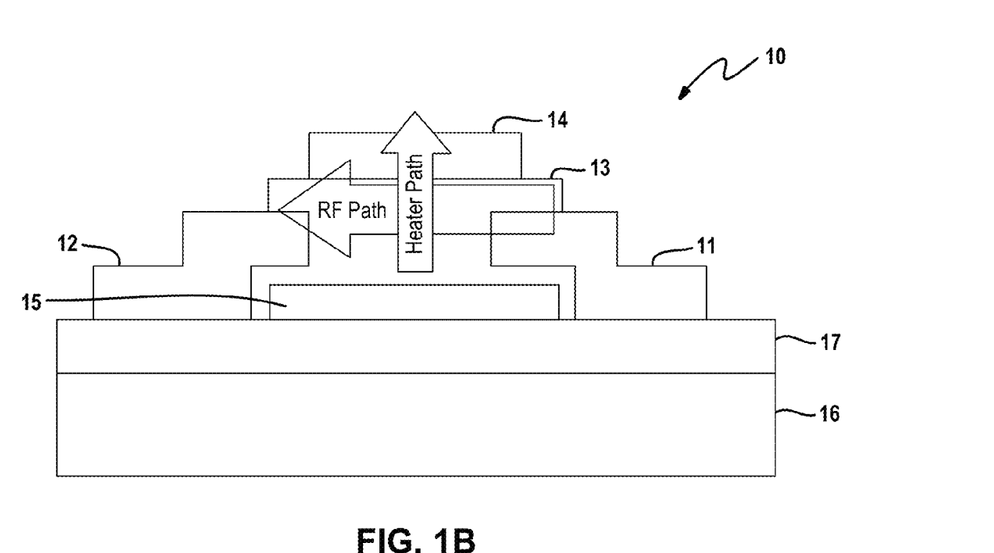
FIG. 1B is a cross-sectional view of the phase change switch.

FIGS. 1A and 1B illustrates an example embodiment of an RF switch 10 with a direct heating method. The RF switch 10 is comprised of two RF electrodes 11, 12 disposed on opposing sides of a phase change element 13. Depending on the state of the phase change material, the RF electrodes form a conductive path through the phase change material for an RF signal. In the example embodiment, the phase change element 13 is comprised of germanium telluride. Other suitable materials that exhibit variable electrical resistivity depending on crystallinity, such as germanium antimony telluride or germanium selenium, are contemplated by this disclosure.

To control the state of the phase change material, the RF switch 10 further includes a heater formed from two heater electrodes 14, 15. More specifically, a bottom heater electrode 15 disposed onto a surface of the substrate 16. In some embodiments, a passivation layer 17 (e.g., 1 μm thick aluminum nitride) may be disposed between the bottom heater electrode 15 and the substrate 16. A phase change element 13 is disposed onto the bottom heater electrode 15 and a top heater electrode 14 is disposed onto the phase change element 13. In this way, the top and bottom heater 14, 15 are configured to draw a current through the phase change element 13 in a direction transverse to the conductive path, as shown in FIG. 1B.

Figure 2A:
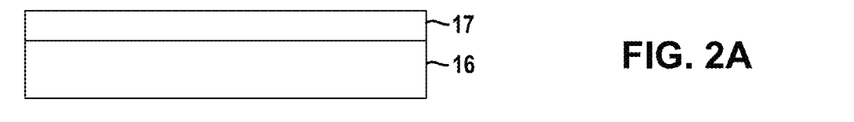
FIGS. 2A-2F illustrate an example fabrication process of for the phase change switch shown in FIG. 1A.
Figure 2B:
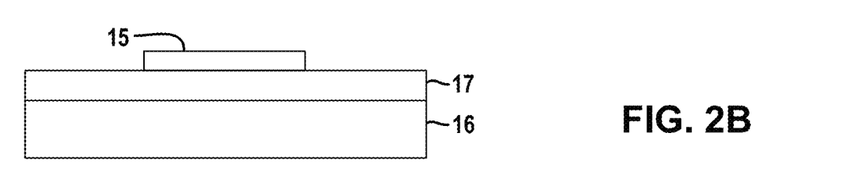

The fabrication process is further described in relation to FIGS. 2A-2F. In the example embodiment, the fabrication process starts with the deposition of a passivation layer 17, such as 1 μm thick aluminum nitride, on a silicon substrate 16 as shown in FIG. 2A. Aluminum nitride is chosen in the example embodiment because of its high thermal conductivity and low loss tangent at GHz frequencies. The bottom heater layer 15 is then deposited and patterned as seen in FIG. 2B. In the example embodiment, the top heater electrode 14 and the bottom heater electrode 15 are comprised of titanium nitride. Other suitable materials for the heater electrodes include nickel chromium (NiCr), nickel chromium silicon (NiCrSi), tungsten (W), platinum and similar metals or metal alloys.

Figure 2C:
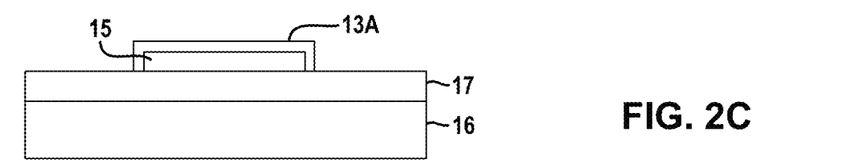

Next, a first layer 13A of phase change material is sputtered and patterned as shown in FIG. 2C. In the example embodiment, a layer of germanium telluride is sputtered and patterned at thickness of 125 nm. The RF electrodes 11, 12 are then deposited, for example as a 0.5 μm thick gold (Au) layer with thin titanium (Ti) layers, for example, on both sides as diffusion barriers. The RF electrodes 11, 12 may be comprised of other suitable metals such as copper or platinum.

Figure 2D:
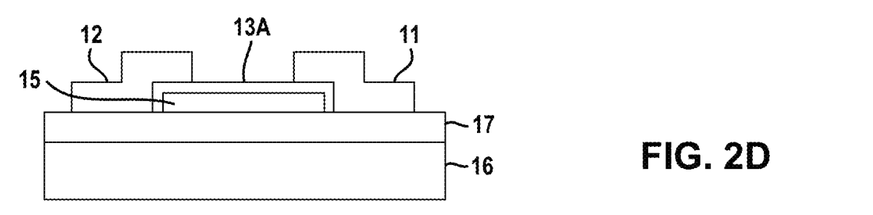
Figure 2E:
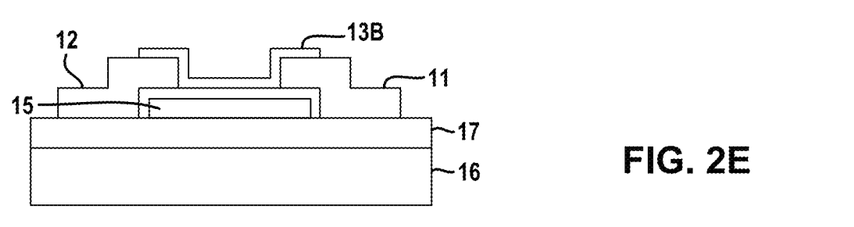

In the example embodiment, the RF electrodes 11, 12 abut opposing side surfaces of the phase change element 13. In some embodiments, the RF electrodes overlap onto a top surface of the phase change element as shown in FIG. 2D. The construct of the phase change element 13 is completed by depositing a second layer 13B of germanium telluride as shown in FIG. 2E. As a result, a portion of the input electrode 11 and a portion of the output electrode 12 protrude into side surfaces of the phase change element 13, thereby decreasing contact resistance between the RF electrodes 11, 12 and the phase change element 13. In other embodiments, it is envisioned that the RF electrodes 11, 12 abut the side surfaces of the phase change element 13 without protruding into the side surfaces thereof (not shown). After deposition of each layer of phase change material, oven baking at a temperature slightly higher than the crystallization temperature of the phase change layer is performed to crystallize the phase change layer.

Figure 2F:
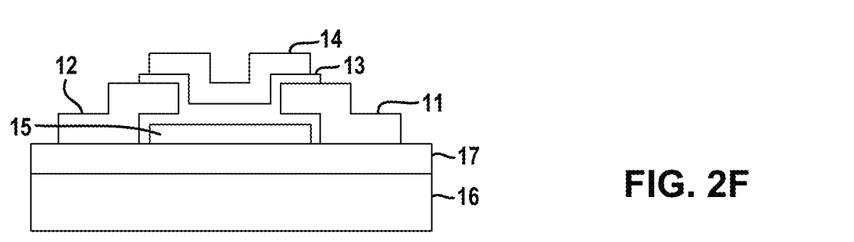

Finally, the top heater layer 14 is deposited and patterned as shown in FIG. 2F. In some embodiments, a second passivation layer (not shown) may also be deposited onto the top heater layer 14 and the RF electrodes 11, 12 as the top surface of the RF switch 10. While an exemplary embodiment of an RF switch has been described above with specific layers having specific materials and arranged in a specific configuration, it will be appreciated that this device may be constructed with many different arrangements and materials as necessary or desired for a particular application. The above arrangement and materials are presented only to describe one particular embodiment that has proven effective and should be viewed as illustrating, rather than limiting, the present invention.

Figure 3A:
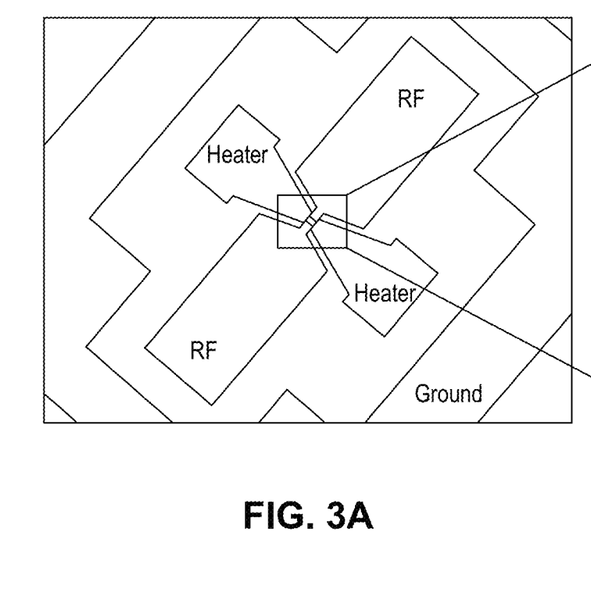
FIGS. 3A and 3B are partial top views of the phase change switch.
Figure 3B:
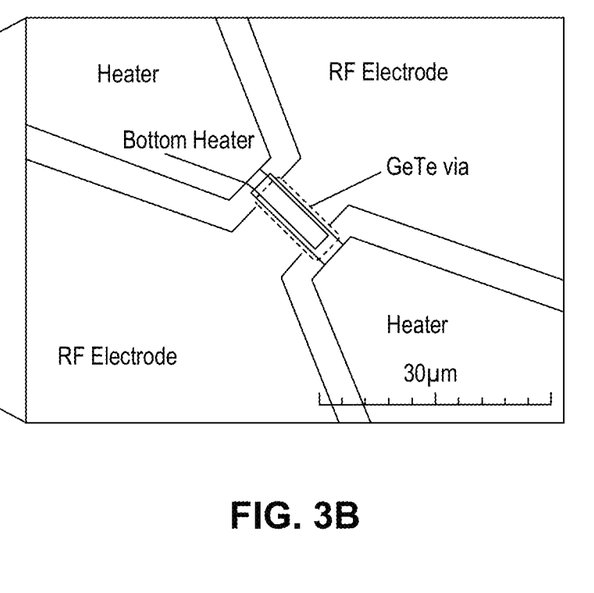

FIGS. 3A and 3B depict a top view of the RF switch 10. The specific device shown in these figures has an RF connection width of 12 µm and a spacing of 0.6 µm. In different designs, the width of the RF electrodes varies from a few nanometers to a few micrometers, and the spacing between the electrodes varies also from a few nanometers to a few micrometers. The top heater electrode 14 and the bottom heater electrode (shown as a box) each having at least one dimension that narrows from both sides as it approaches a center of the phase change material 13, thereby concentrating the heat on the phase change material. In the example embodiment, the top heater electrode 14 or the bottom heater electrode 15 having a shape of a bow tie although other shapes are also contemplated by this disclosure. The heater layers are vertically connected through the phase change via and the overlap between the top and bottom heater layers is approximately 13 µm×5 µm, with variation among different designs. The two RF signal pads together with the ground ring form two coplanar transmission lines with a characteristic impedance of 50Ω, matching the termination impedance. The central part of the heater path is made out of titanium nitride (TiN) as indicated at 41 of FIG. 4A, but the heater feed-lines are covered with gold to ensure that the resistance along the heater path concentrates in the center germaium telluride (GeTe) area to effectively heat GeTe volume and obtain reliable phase transition with minimum power consumption.

Figure 4A:
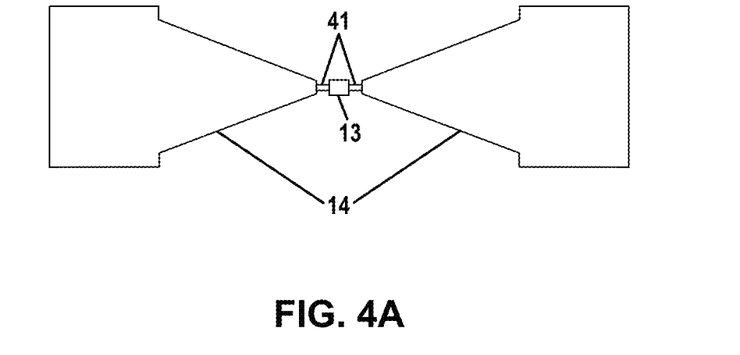
FIGS. 4A and 4B are diagrams of an example heater path and an equivalent circuit mode of the heater path, respectively.
Figure 4B:
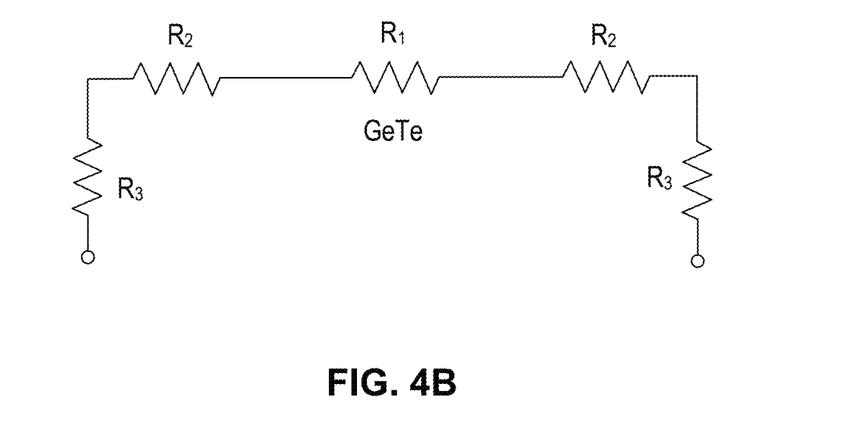

FIG. 4 shows the layout and equivalent DC circuit model of the heater layer path. In FIG. 4B, resistor $R_I$ represents the vertical resistance of GeTe, which varies between the crystalline (ON) and amorphous (OFF) states. Resistors $R_2$ represent the TiN sections of the heater path, and $R_3$ is the resistance of each DC pad covered with Au. From modeling and simulation, the value of $R_I$ (GeTe resistance) is smaller than 5Ω at the crystalline state and is above 5 kΩ at amorphous state. $R_3$ is within 5Ω as gold is a good conductor. $R_2$ varies between a few 10's of ohms to about a kΩ in different designs. Therefore, when GeTe is at crystalline state, the resistance along the heater path is concentrated at the TiN sections, ensuring that the generated heat is only used to phase transition GeTe. When GeTe is at the amorphous state, $R_I$ becomes the dominant resistance, and the resistance of TiN($R_2$) serves as protection for GeTe, so that once GeTe is back to the crystalline state, most power is dissipated in the TiN sections and GeTe is not instantly heated back to the amorphous state.

Figure 5A:
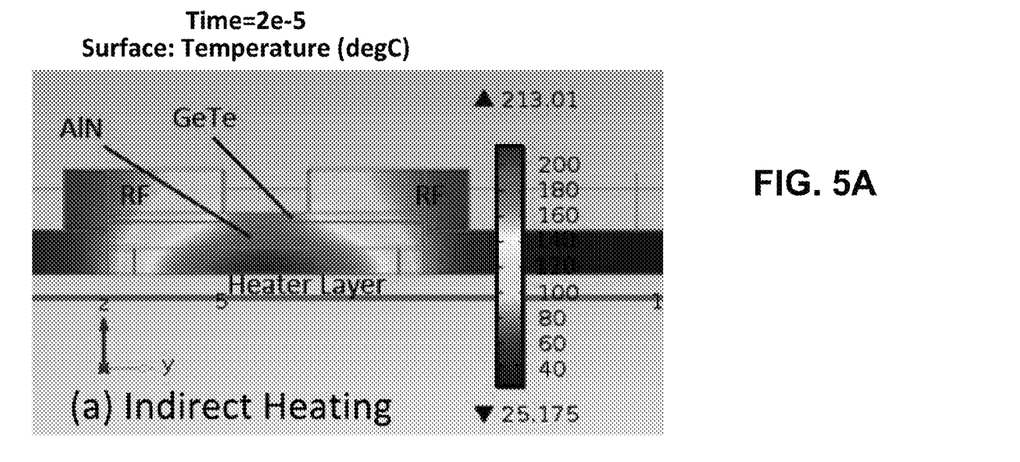
FIGS. 5A and 5B are cross sectional views of temperature distribution when a current pulse is applied to an indirectly heated switch with one single heater line and directly heated switch, respectively.
Figure 5B:
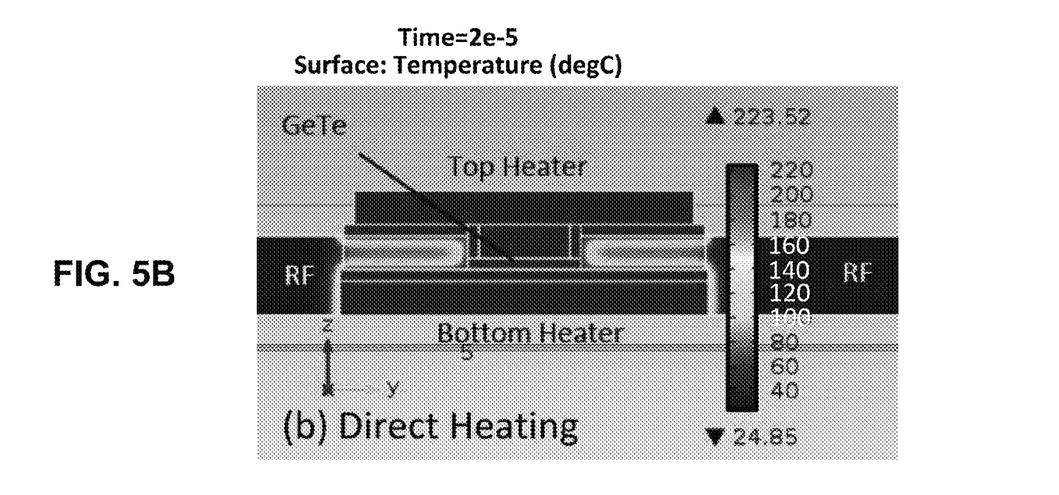

Thermal simulations are performed using COMSOL finite element tool to analyze the joule heating profile. The thermal profile of directly heated phase change switches is compared to that using conventional indirect heating method. The size of the indirectly heated switch is the same as the directly heated one shown in FIGS. 5A and 5B. However, for the indirectly heated switch, the heater path is electrically isolated (but thermally coupled) to the GeTe layer by a thin (300 nm) layer of AlN. As shown in FIG. 5A, using the indirect heating method, most heat generated by the heater is dissipated isotropically and the contact between the RF and GeTe layers is at a much lower temperature than the heater temperature (indicating a local cold spot at the RF-GeTe contact). This results in low power efficiency as well as incomplete state transitions for the GeTe via. The direct heating method, on the other hand, allows current to flow through the via, uniformly heating the entire phase change volume. Not only will this improve the power efficiency, but also complete phase transition is ensured, resulting in lower ON resistance. This is one of the advantages of the disclosed directly heated phase change switch scheme.

DC measurements to verify the biasing condition of the heater are performed using DC probes and a Digital Multi-Meter. Joule heating currents are generated using a voltage function generator. The initial (ON state) DC resistance of GeTe along the RF path, after de-embedding the resistance of the probes and feed-lines, is about 3.9Ω in this example. After applying a heating voltage pulse through the heater layer path with an amplitude of ~8.5 V and pulse width of 2 µs, GeTe is transitioned to amorphous state with resistance value ranging from 8 kΩ to 100 kΩ. By applying a heating voltage pulse with an amplitude of about 9 V and with a longer falling edge, GeTe is transitioned back to the crystalline state (ON state). The required heating power for amorphization and crystallization of this example switch is ~73 mW and 9 mW, respectively. Transitions between the two states have been performed repeatedly.

Figure 6A:
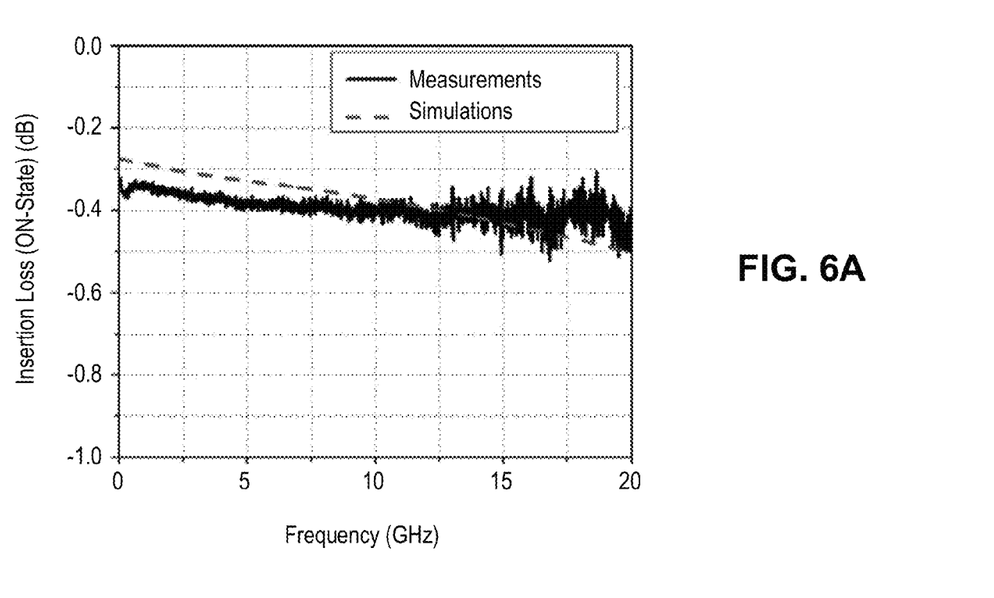
FIGS. 6A and 6B are graphs depicting measured and simulated results of the phase change switch at the on state and off state, respectively.
Figure 6B:
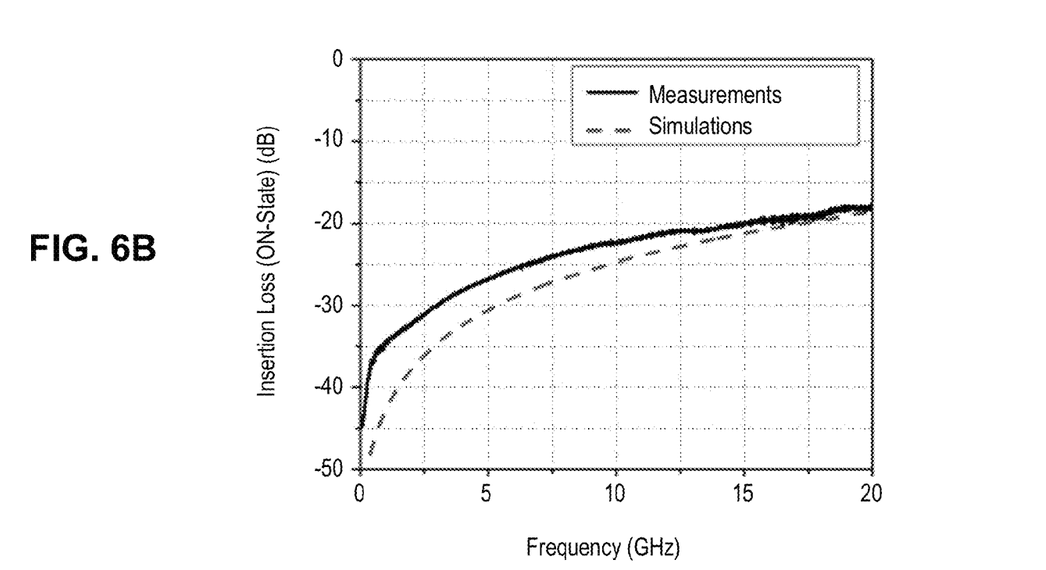

RF measurements are performed using Ground-Signal-Ground (GSG) probes and a network analyzer. The on-wafer measurement and the ANSYS HFSS electromagnetics simulation results are shown in FIGS. 6A and 6B. The ohmic loss of probes and signal lines are de-embedded from measured data. In simulations, the conductivity of GeTe in the crystalline state is taken as $5 \times 10^4$ S/m, while its amorphous state conductivity is taken as 1 S/m. The discrepancy between measurements and simulations are mostly due to a lower OFF/ON resistance ratio achieved in this fabrication run.

Previous works analyzed that the power handling of phase change switches with a structure in which the heater affects a larger portion of the GeTe volume is higher than switches where the RF path completely sandwiches the phase change layer. From this analysis, it is expected that the power handling 1 dB compression point ($P_{1dB}$), and third-order input intercept point ($IIP_3$) performance of the presented switches outperform the performance of conventional directly heated vias. The $P_{1dB}$ and $IIP_3$ of the switch are measured at both states to verify the power handling. The worst case $P_{1dB}$ is verified to be above 20 dBm (the maximum input power is tool limited). The ON-state $IIP_3$ is measured to be 30.5 dBm at 2 GHz with frequency offset of 50 kHz. OFF-state $IIP_3$ value is also >30 dBm. As expect, the $IIP_3$ of this switch is in fact higher than conventional directly heated switches in which the RF input/output sandwich the phase change layer.

Figure 7:
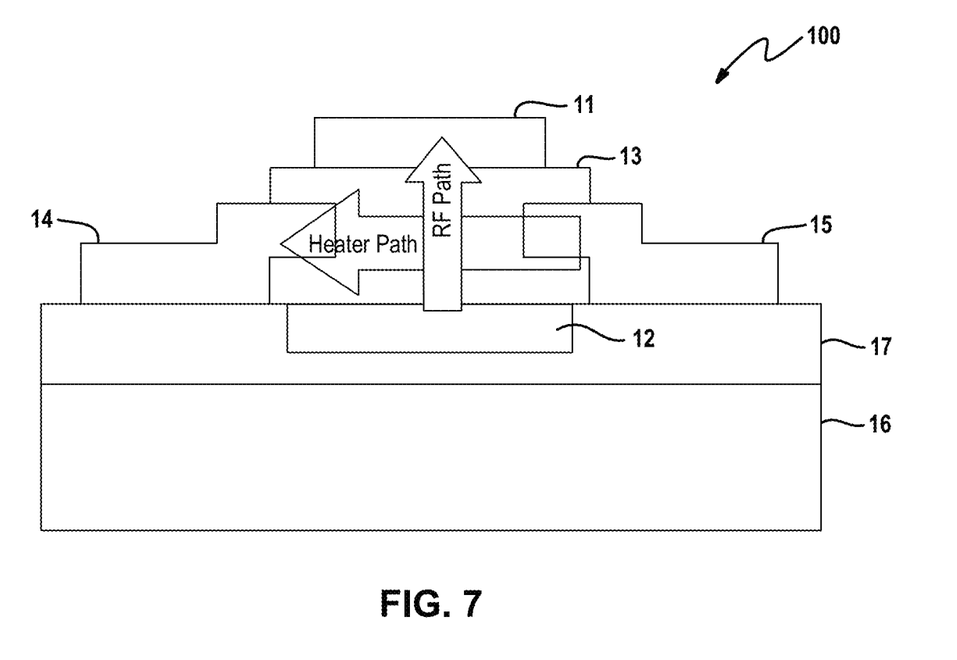
FIG. 7 is a cross-sectional view of an alternative embodiment of a phase change switch.

FIG. 7 is an alternative embodiment for an RF switch 100. In this arrangement, the RF electrodes 11, 12 are placed above and below the phase change element 13, respectively to form a vertical RF signal path. Conversely, the two heater electrodes 14, 15 are arranged laterally on opposing side of the phase change element 13 to form a lateral heating path. Except with respect to these differences, the RF switch 100 may be substantially the same as RF switch 10, including variations thereof, as described above.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An RF switch having two ports, comprising:
    a substrate;
    a bottom heater electrode disposed onto a surface of the substrate;
    a phase change material disposed onto the bottom heater electrode;
    an input electrode and an output electrode disposed on opposing sides of the phase change material and operable to form a conductive path for an RF signal through the phase change material; and
    a top heater electrode disposed onto the phase change material, wherein the top and bottom heater electrodes are configured to draw a current through the phase change material in a direction transverse to the conductive path.

2. The RF switch of claim 1 wherein the top heater electrode and the bottom heater electrode each having at least one dimension that narrows from both sides as it approaches a center of the phase change material, thereby concentrating the heat on the phase change material.

3. The RF switch of claim 1 wherein at least one of the top heater electrode and the bottom heater electrode having shape of a bow tie.

4. The RF switch of claim 1 wherein at least one of the top heater electrode or the bottom heater electrode overlaps with at least a portion of the input electrode and at least a portion of the output electrode and the at least one top heater electrode or the bottom heater electrode is electrically separated by the phase change layer from the overlapped portions of the input electrode and the output electrode.

5. The RF switch of claim 1 further comprises a passivation layer disposed between the bottom heater electrode and the substrate.

6. The RF switch of claim 1 wherein the phase change material is further defined as germanium telluride.

7. The RF switch of claim 1 wherein the input electrode and the output electrode abut opposing side surfaces of the phase change material, such that a portion of the input electrode and a portion of the output electrode protrude into side surfaces of the phase change material.

8. The RF switch of claim 1 wherein the input electrode and the output electrode are comprised of gold and the top heater electrode and the bottom heater electrode are comprised of titanium nitride.

9. The RF switch of claim 1 further comprises a protection layer disposed on the top heater electrode and the phase change material.

10. An RF switch having two RF ports, comprising:
    a substrate;
    a bottom heater electrode disposed onto a surface of the substrate and configured to concentrate heat at a center of the bottom heater electrode;
    a phase change material disposed onto the bottom heater electrode;
    an input electrode disposed on the phase change layer and configured to conduct an RF signal;
    an output electrode disposed on the phase change layer and configured to conduct an RF signal, wherein the input electrode and the output electrode abut opposing side surfaces of the phase change material; and
    a top heater electrode disposed onto the phase change material and configured to concentrate heat at a center of the top heater electrode, wherein the top and bottom heater electrodes are operable to draw a current through the phase change material in a direction transverse to a conductive path through the phase change material for the RF signal.

11. The RF switch of claim 10 wherein a portion of the input electrode protrudes into the phase change material and a portion of the output electrode protrudes into the phase change material.

12. An RF switch having two ports, comprising:
    a substrate;
    a bottom RF electrode disposed onto a surface of the substrate;
    a phase change material disposed onto the bottom RF electrode;
    two heater electrodes disposed on the phase change material, wherein the two heater electrodes are arranged on opposing sides of the phase change material and form an electrical heating path therethrough; and a top RF electrode disposed onto the phase change material, wherein the top and bottom RF electrodes are configured to form an RF conductive path which is transverse in relation to the electrical heating path.

13. The RF switch of claim 12 wherein the two heater electrodes each having at least one dimension that narrows from both sides as it approaches a center of the phase change material, thereby concentrating the heat on the phase change material.

14. The RF switch of claim 12 wherein at least one of the top RF electrode or the bottom RF electrode overlaps with at least a portion of the two heater electrodes and the at least one top RF electrode or the bottom RF electrode is electrically separated by the phase change layer from the overlapped portions of the two heater electrodes.

15. The RF switch of claim 12 further comprises a passivation layer disposed between the bottom RF electrode and the substrate.

16. The RF switch of claim 12 wherein the phase change material is further defined as germanium telluride.

17. The RF switch of claim 12 wherein two heater electrodes abut opposing side surfaces of the phase change material, such that a portion of each heater electrode protrude into side surfaces of the phase change material.

18. The RF switch of claim 12 wherein the top RF electrode and the bottom RF electrode are comprised of gold and the two heater electrodes are comprised of titanium nitride.

19. The RF switch of claim 12 further comprises a protection layer disposed on the top RF electrode and the phase change material.

* * * * *